(12) United States Patent
Lee et al.

(10) Patent No.: US 10,770,524 B2
(45) Date of Patent: Sep. 8, 2020

(54) ORGANIC LIGHT-EMITTING DISPLAY DEVICE

(71) Applicant: LG DISPLAY CO., LTD., Seoul (KR)

(72) Inventors: Yongbaek Lee, Paju-si (KR); Junseok Byun, Paju-si (KR); Dongyoung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/200,058

(22) Filed: Nov. 26, 2018

(65) Prior Publication Data

US 2019/0165066 A1    May 30, 2019

(30) Foreign Application Priority Data

Nov. 29, 2017 (KR) ........................ 10-2017-0161459

(51) Int. Cl.
*H01L 51/52* (2006.01)
*H01L 27/32* (2006.01)

(52) U.S. Cl.
CPC ........ *H01L 27/3246* (2013.01); *H01L 27/326* (2013.01); *H01L 51/5284* (2013.01); *H01L 27/322* (2013.01); *H01L 51/5253* (2013.01)

(58) Field of Classification Search
CPC . H01L 27/3246; H01L 27/326; H01L 27/322; H01L 51/5284; H01L 51/5253
See application file for complete search history.

(56) References Cited

U.S. PATENT DOCUMENTS

| 2003/0146695 A1 | 8/2003 | Seki |
| 2017/0194602 A1 | 7/2017 | Cui et al. |

FOREIGN PATENT DOCUMENTS

| GB | 2544899 A | 5/2017 |
| JP | 2007-227275 A | 9/2007 |
| JP | 2009230089 | * 10/2009 |
| JP | 2014-044938 A | 3/2014 |
| JP | 2015-069861 A | 4/2015 |
| KR | 10-2008-0094214 A | 8/2006 |
| KR | 10-1705564 B1 | 2/2017 |
| TW | 201721926 A | 6/2017 |

* cited by examiner

*Primary Examiner* — Matthew L Reames
(74) *Attorney, Agent, or Firm* — Birch, Stewart, Kolasch & Birch, LLP

(57) ABSTRACT

An organic light-emitting display device includes pixels, a bank that defines the pixels and has at least one hollow portion formed between the pixels which neighbor each other, and a light stopper. At least part of the light stopper is inserted into the hollow portion.

9 Claims, 14 Drawing Sheets

ORGANIC LIGHT-EMITTING DISPLAY DEVICE

This application claims the priority benefit of Korean Patent Application No. 10-2017-0161459, filed on Nov. 29, 2017 in the Republic of Korea, which is incorporated herein by reference for all purposes as if fully set forth herein.

BACKGROUND OF THE INVENTION

Field of the Invention

The present disclosure relates to an organic light-emitting display device.

Related Art

Recently, various display devices that are less bulky and more lightweight than cathode ray tubes (CRTs) are being developed. Examples of these display devices include liquid crystal displays (LCDs), field emission displays (FEDs), plasma display panels (PDPs), organic light-emitting display devices (OLEDs), etc.

Among these display devices, organic light-emitting displays are self-emission displays that emit light through excitation of organic compounds. In contrast to LCDs, the organic light-emitting displays work without a backlight. Thus, the organic light-emitting displays have advantages of a thin profile, lightness in weight, and a simpler manufacturing process. Also, the organic light emitting displays are widely used because they can be manufactured at low temperatures, have a fast response time of 1 ms or less, and feature low power consumption, wide viewing angle, and high contrast.

An organic light-emitting display comprises pixels each having an organic light-emitting diode that converts electrical energy into light energy. The organic light-emitting diode comprises an anode, a cathode, and an organic compound layer situated between the anode and cathode. Holes and electrons are injected from the anode and cathode, respectively, and they recombine to form excitons, whereby the organic light-emitting display displays an image when the excitons fall from the excited state to the ground state.

The organic compound layer can comprise red (R), green (G), and blue (B) organic compound layers. They can be formed to correspond to red (R), green (G), and blue (B) pixels, respectively. A fine metal mask (FMM) is typically used to pattern the red (R), green (G), and blue (B) pixels. However, even with the dramatic advances in the processing technology, there are limitations in using the FMM to make high-resolution displays. As a matter of fact, when the FMM is used to realize the resolution above 1,000 PPI, it is currently hard to achieve a process yield of more than a certain level.

Moreover, in order to implement a large-area high-resolution display device, a large-area FMM mask corresponding thereto is required. However, the larger the area of the mask, the more the center will sag under the weight, which leads to various defects such as displacement of the organic compound layer.

SUMMARY OF THE INVENTION

The present disclosure provides an organic light-emitting display that improves display quality by minimizing color mixing defects, and which addresses the limitations and disadvantages associated with the related art.

In one aspect, there is provided an organic light-emitting display device comprising pixels, a bank that defines the pixels and has at least one hollow portion formed between the pixels which neighbor each other, and a light stopper, at least part of which is inserted into the hollow portion.

The top surface of the light stopper can be spaced a preset distance apart from the top surface of the bank.

The hollow portion can have the shape of a hole that fully penetrates the entire thickness of the bank.

The hollow portion can have the shape of a recess formed by partially recessing the top surface of the bank inward.

The light stopper can be selectively disposed between pixels that emit light of different colors.

The pixels can include a first pixel that emits light of a first color, a second pixel that neighbors the first pixel in a first direction and emits light of a second color, and a third pixel that neighbors the first pixel in a second direction and emits light of the first color. The light stopper can be situated between the first pixel and the second pixel but not between the first pixel and the third pixel.

The organic light-emitting display device can further comprise first electrodes allocated individually to the pixels, an organic compound layer that disposes on the first electrodes and covers the pixels, and a second electrode that is disposed on the organic compound layer and covers the pixels. The organic compound layer can be physically separated on the bank in at least one region where the light stopper is placed. The second electrode can be physically separated on the bank in the at least one region.

The organic light-emitting display device can further comprise a barrier surrounding the light stopper. The barrier can be divided into a first portion and a second portion. The first portion and the second portion can be made of different materials. The barrier can include an inorganic material. The light stopper can be black in color.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DESCRIPTION OF THE EMBODIMENTS

Figure 1:
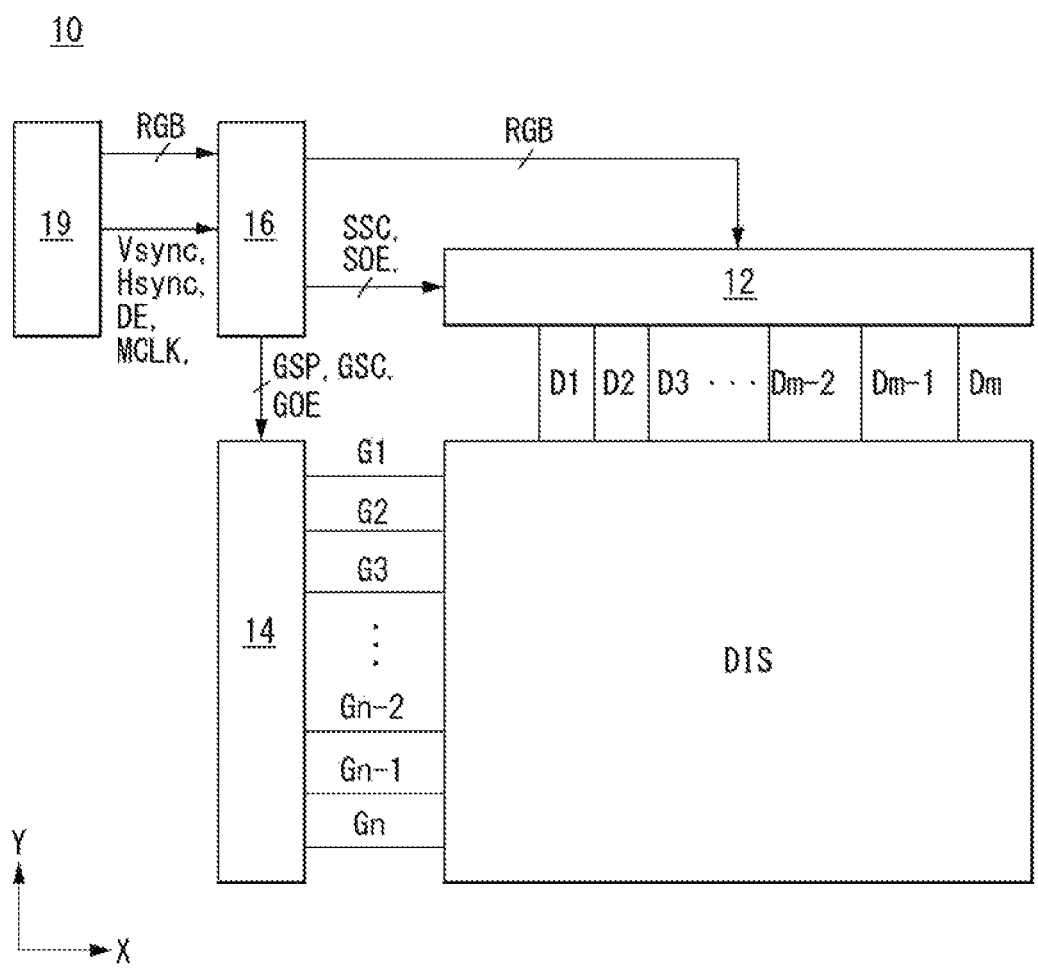
FIG. 1 is a block diagram of an organic light-emitting display device according to the present disclosure.

Hereinafter, exemplary embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they can unnecessarily obscure the subject matter of the present disclosure. In describing various exemplary embodiments, descriptions of the same or like components will be given in the beginning but omitted in other exemplary embodiments.

Although terms including ordinal numbers such as "first" and "second" can be used to describe various components, the components are not limited by the terms. The terms are used only to distinguish one component from other components.

Figure 2:
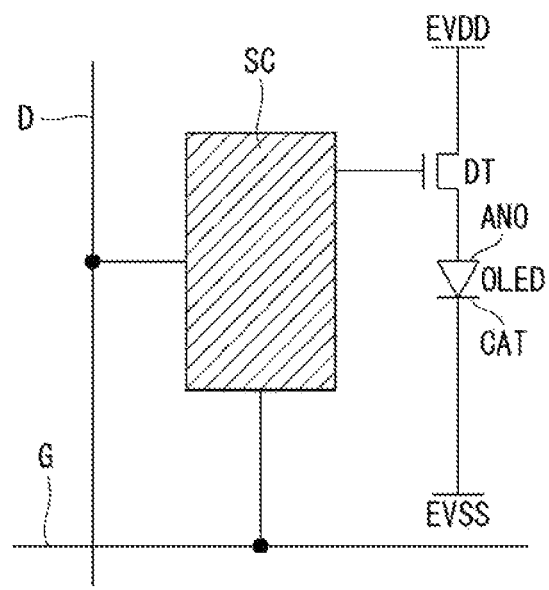
FIG. 2 is a schematic diagram of a pixel shown in FIG. 1.
Figure 3:
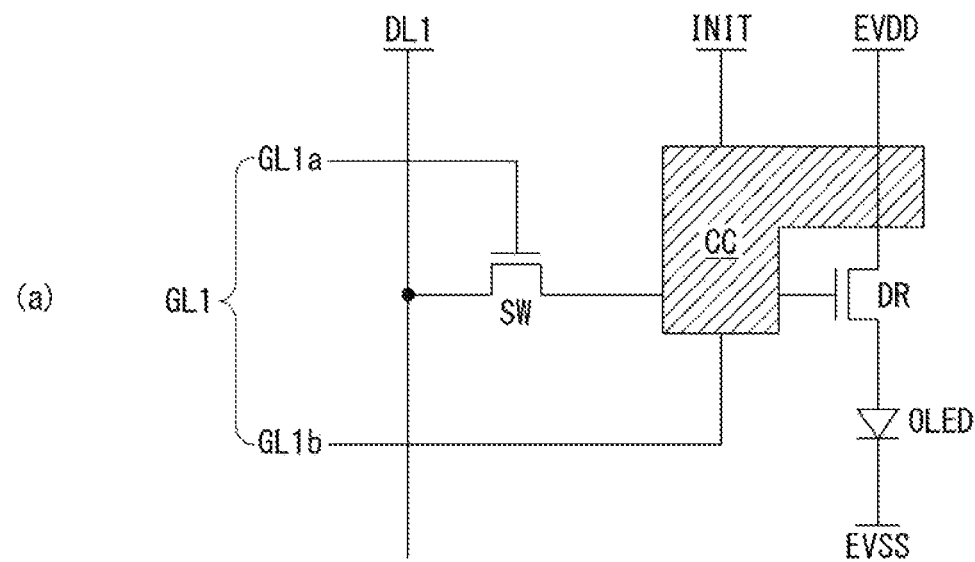
FIG. 3 is diagrams showing concrete examples of FIG. 2.
Figure 3:
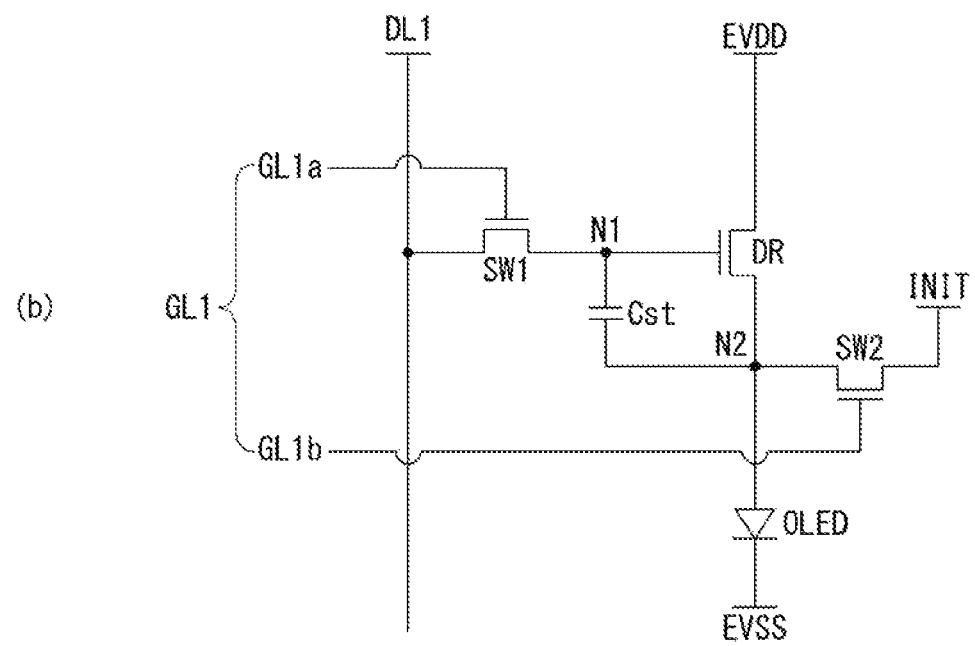
Figure 4:
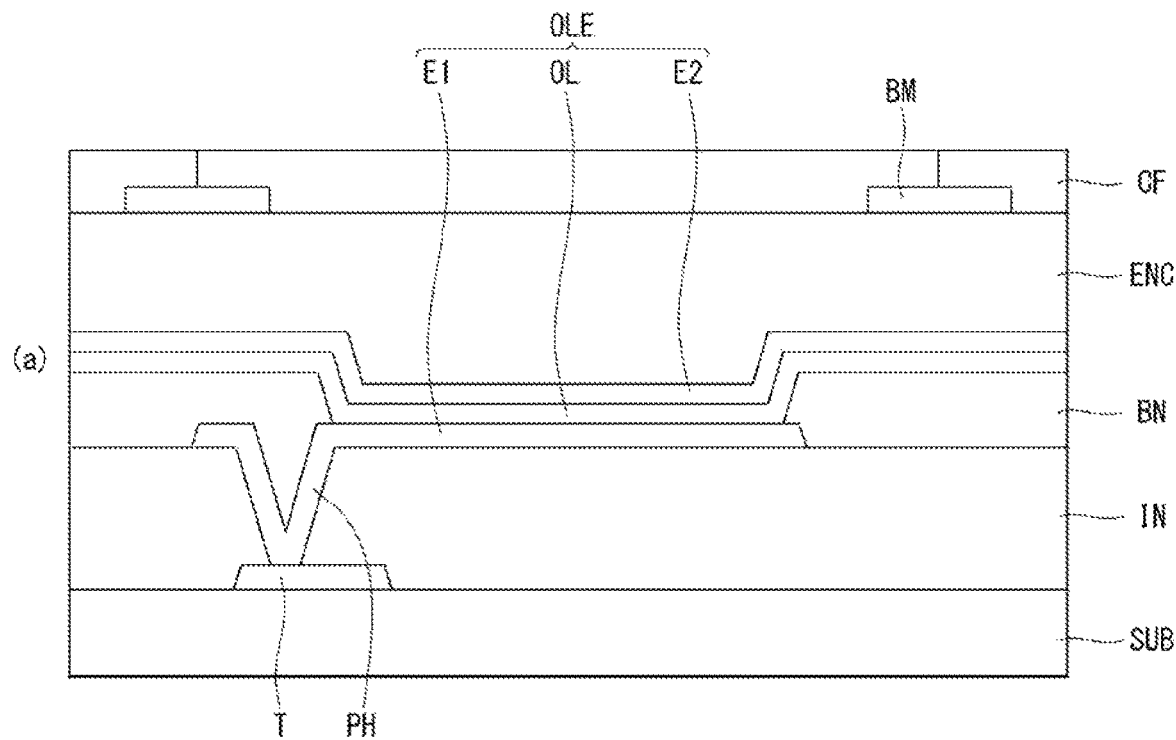
FIG. 4 is a cross-sectional view of a pixel of an organic light-emitting display device according to the present disclosure.
Figure 4:
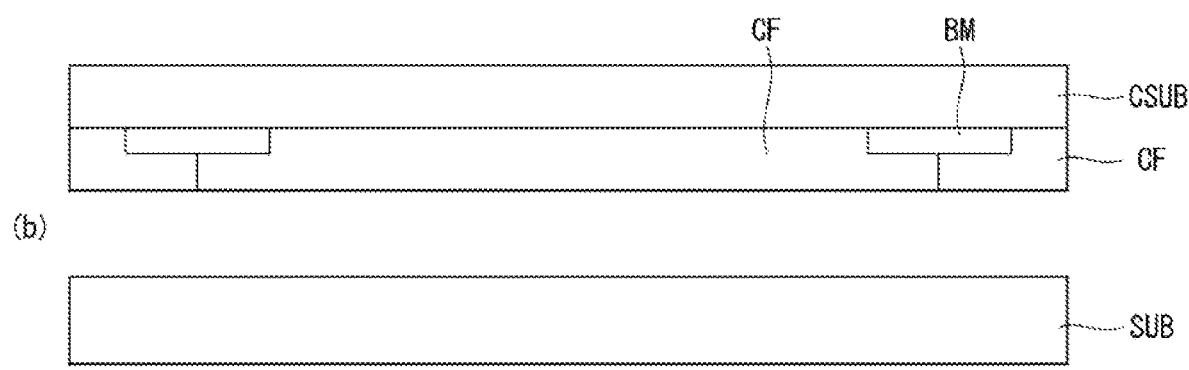
Figure 5:
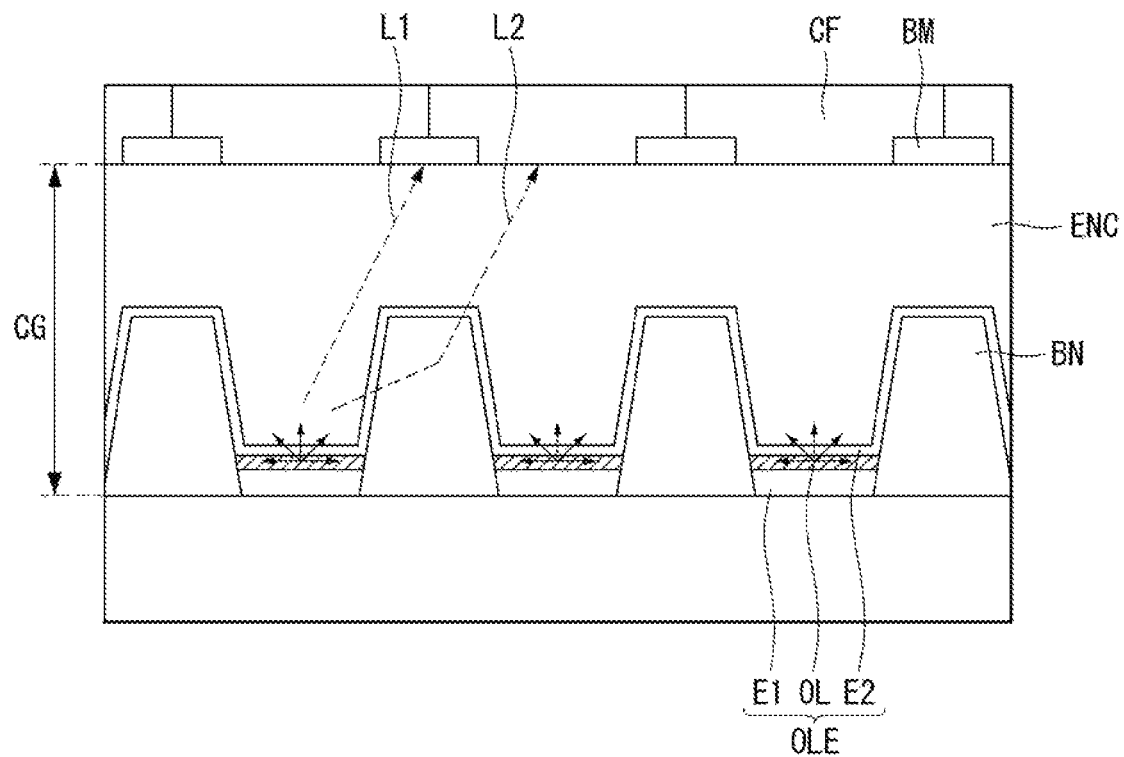
FIG. 5 is a view for explaining problems with the related art.

FIG. 1 is a block diagram of an organic light-emitting display device according to the present disclosure. All the components of the organic light-emitting display device according to all embodiments of the present disclosure are operatively coupled and configured. FIG. 2 is a schematic diagram of a pixel shown in FIG. 1. FIG. 3 is diagrams showing concrete examples of FIG. 2. FIG. 4 is a cross-sectional view of a pixel of an organic light-emitting display device according to the present disclosure. FIG. 5 is a view for explaining problems with the related art.

Referring to FIG. 1, an organic light-emitting display device 10 according to the present disclosure comprises a display drive circuit and a display panel DIS.

The display drive circuit comprises a data drive circuit 12, a gate drive circuit 14, and a timing controller 16 and writes vides data voltages of an input image to the pixels PXL on the display panel DIS. The data drive circuit 12 converts digital video data RGB inputted from the timing controller 16 into analog gamma-compensated voltages to generate data voltages. The data voltages outputted from the data drive circuit 12 are supplied to data lines D1 to Dm. The gate drive circuit 14 sequentially supplies gate signals to gate lines G1 to Gn in synchronization with the data voltages and selects pixels PXL from the display panel DIS to write the data voltages to.

The timing controller 16 receives, from a host system 19, timing signals such as a vertical synchronization signal Vsync, a horizontal synchronization signal Hsync, a data enable signal DE, and a main clock MCLK, and synchronizes the operation timings of the data drive circuit 12 and gate drive circuit 14 with each other. Data timing control signals for controlling the data drive circuit 12 comprise a source sampling clock (SSC), a source output enable signal (SOE), etc. Gate timing control signals for controlling the gate drive circuit 14 comprise a gate start pulse (GSP), a gate shift clock (GSC), a gate output enable signal (GOE), etc.

The host system 19 can be any one of the following: a television system, a set-top box, a navigation system, a DVD player, a Blu-ray player, a personal computer PC, a home theater system, and a phone system. The host system 19 comprises a system-on-chip (SoC) having a scaler incorporated in it, and converts digital video data RGB of an input image into a format suitable for display on the display panel DIS. The host system 19 sends timing signals Vsync, Hsync, DE, and MCLK, along with the digital video data, to the timing controller 16.

The display panel DIS can have various shapes. That is, the plane of the display panel DIS can be rectangular or square, and also can have various free-form shapes, such as a circle, an ellipse, or a polygon.

The display panel DIS comprises red (R), blue (B), and green (G) pixels PXL that emit light red (R), blue (B), and green (G) light, respectively. If required, the display panel DIS can further comprise pixels PXL that emit light of another color, such as white (W). For ease of explanation, a description will be given below with respect to a display panel DIS comprising red (R), blue (B), and green (G) pixels PXL, for example.

The pixels PXL can have various shapes. For example, the plane of the pixels PXL can have various shapes, such as circular, elliptical, or polygonal. One of the pixels PXL can have a different size and/or different planar shape from another. Each of the pixels PXL comprises an organic light-emitting diode.

The organic light-emitting display according to the present disclosure comprises an organic compound layer OL that emits white light (W) and red (R), blue (B), and green (G) color filters, in order to produce red (R), blue (B), and green (G) colors. That is, the organic light-emitting display can produce red (R), green (G), and blue (B) colors as the white light (W) emitted from the organic compound layer OL passes through the red (R), blue (B), and green (G) color filters corresponding to the red (R), green (G), and blue (B) pixels PXL.

In the organic light-emitting display according to the present disclosure, the organic compound layer OL emitting white light (W) is made wide enough to cover most of the entire surface of the panel, so there is no need to use FMM to allocate red (R), blue (B), and green (G) organic compound layers OL to the corresponding pixels PXL, respectively. Thus, the present disclosure has the advantage of avoiding problems with the use of the aforementioned FMM—for example, a decrease in process yield associated with high resolution and an alignment error which causes displacement of the organic compound layer OL.

Referring to FIG. 2, a plurality of data lines D and a plurality of gate lines G intersect on the display panel DIS of FIG. 1, and the pixels PXL are arranged in a matrix at the intersections. Each of the pixels PXL comprises an organic light-emitting diode OLED, a driving thin-film transistor DT that controls the amount of current flowing through the organic light-emitting diode OLED, and a programming part SC for setting the gate-source voltage of the driving thin-film transistor DT.

The programming part SC can comprise at least one switching thin-film transistor and at least one storage capacitor. The switching thin-film transistor turns on in response to a gate signal from a gate line G to apply a data voltage from a data line D to one electrode of the storage capacitor. The driving thin-film transistor DT adjusts the amount of light emitted from the organic light-emitting diode OLED by controlling the amount of current supplied to the organic light-emitting diode OLED depending on the level of voltage stored in the storage capacitor. The amount of light emitted from the organic light-emitting diode OLED is proportional to the amount of current supplied from the driving thin-film transistor DT. Such a pixel PXL is connected to a high-level voltage source Evdd and a low-level voltage source Evss to receive high-level power supply voltage and low-level power supply voltage from a power generating part. The thin-film transistors of the pixel PXL can be implemented as p-type or n-type. Moreover, semiconductor layers of the thin-film transistors of the pixel PXL can contain amorphous silicon, polysilicon, or oxide. A description will be given below with respect to a semiconductor layer that contains oxide. The organic light-emitting diode OLED comprises an anode ANO, a cathode CAT, and an organic compound layer sandwiched between the anode ANO and cathode CAT. The anode ANO is connected to the driving thin-film transistor DT.

As shown in (a) of FIG. 3, a subpixel can comprise an internal compensation circuit CC, as well as the aforementioned switching transistor SW, driving transistor DR, capacitor Cst, and organic light-emitting diode OLED. The internal compensation circuit CC can comprise one or more transistors connected to a compensation signal line INIT. The internal compensation circuit CC sets the gate-source voltage of the driving transistor DR to a voltage that reflects variation in threshold voltage, so as to cancel out any brightness variation caused by the threshold voltage of the driving transistor DR when the organic light-emitting diode OLED emits light. In this case, the scan line GL1 comprises at least two scan lines GL1a and GL1b for controlling the switching transistor SW and the transistors in the internal compensation circuit CC.

As shown in (b) of FIG. 3, the subpixel can comprise a switching transistor SW1, a driving transistor DR, a sensing transistor SW2, a capacitor Cst, and an organic light-emitting diode OLED. The sensing transistor SW2 is a transistor that can be included in the internal compensation circuit CC, and performs a sensing operation for compensating for the subpixel.

The switching transistor SW1 serves to supply a data voltage supplied through the data line DL1 to a first node N1, in response to a scan signal supplied through the first scan line GL1a. The sensing transistor SW2 serves to reset or sense a second node N2 situated between the driving transistor DR and the organic light-emitting diode OLED, in response to a sensing signal supplied through the second scan line GL1b.

The structure of the subpixel according to the present disclosure is not limited to the above, but can vary, including 2T (transistor)1C (capacitor), 3T1C, 4T2C, 5T2C, 6T2C, and 7T2C.

Referring to (a) and (b) of FIG. 4, an organic light-emitting display according to an exemplary embodiment of the present disclosure comprises a thin-film transistor substrate SUB. On the thin-film transistor substrate SUB, thin-film transistors T individually allocated to pixels and organic light-emitting diodes OLE connected to the thin-film transistors T are placed. Neighboring pixels PXL can be defined by a bank BN (or pixel definition layer), and the planar shape of each pixel PXL can be defined by the bank BN. Thus, the position and shape of the bank BN can be properly selected so that the pixels PXL have a preset planar shape.

The thin-film transistors T can have various structures, including a bottom-gate structure, a top-gate structure, and a double-gate structure. That is, each thin-film transistor T can comprise a semiconductor layer, a gate electrode, and source/drain electrodes. The semiconductor layer, gate electrode, and source/drain electrodes can be arranged on different layers, with at least one insulating layer in between.

At least one insulating layer can be interposed between the thin-film transistor T and the organic light-emitting diode OLE. The insulating layer can comprise a planarization layer made of an organic material such as photoacryl, polyimide, benzocyclobutene resin, or acrylate resin. The planarization layer can planarize the surface of a substrate where the thin-film transistor T and various signal lines are formed. The insulating layer can further comprise a passivation layer composed of a silicon oxide film (SiOx), a silicon nitride film (SiNx), or multiple layers of them, and the passivation layer can be interposed between the planarization layer and the thin-film transistor T. The thin-film transistor T and the organic light-emitting diode OLE can be electrically connected via a pixel contact hole PH penetrating one or more insulating layers.

The organic light-emitting diode OLE comprises first and second electrode E1 and E2 facing each other, and an organic compound layer OL interposed between the first electrode E1 and the second electrode E2. The first electrode E1 can be an anode, and the second electrode E2 can be a cathode.

The first electrode E1 can be composed of a single layer or multiple layers. The first electrode E1 further comprises a reflective layer to function as a reflective electrode. The reflective layer can be made of aluminum (Al), copper (Cu), silver (Ag), nickel (Ni), or an alloy of these elements, preferably, APC (silver/palladium/copper alloy). In an example, the first electrode E1 can be formed of triple layers of ITO/Ag/ITO. The first electrodes E1 can be individually allocated to the pixels—one for each pixel.

A bank BN for defining neighboring pixels is located on the substrate SUB where the first electrodes E1 are formed. The bank BN can be made of an organic material such as polyimide, benzocyclobutene resin, or acrylate resin. The bank BN comprises apertures for exposing most of the center of the first electrodes E1. Parts of the first electrodes E1 exposed by the bank BN can be defined as emitting regions. The bank BN can be disposed to expose the center of the first electrodes E1 but cover the side edges of the first electrodes E1.

An organic compound layer OL emitting white light (W) is formed on the substrate SUB where the bank BN is formed. The organic compound layer OL is disposed to extend on the thin-film transistor substrate SUB so as to cover the pixels. The organic compound layer OL can have a multi-stack structure such as a two-stack structure. The two-stack structure can comprise a charge generation layer CGL situated between the first electrode E1 and the second electrode E2, and a first stack STC1 and a second stack STC2 that are located under and over the charge generation layer CGL sandwiched between them. The first stack STC1 and the second stack STC2 each comprise an emission layer, and can further comprise at least one of common layers such as a hole injection layer, a hole transport layer, an electron transport layer, and an electron injection layer. The emission layer of the first stack STC1 and the emission layer of the second stack STC2 can comprise light-emitting materials of different colors.

In another example, the organic compound layer OL emitting white light (W) can have a single-stack structure. Each single stack comprises an emission layer EML, and can further comprise at least one of common layers such as a hole injection layer HIL, a hole transport layer HTL, an electron transport layer ETL, and an electron injection layer EIL.

The second electrode E2 is formed on the substrate SUB where the organic compound layer OL is formed. The second electrode E2 can be made of a transparent conductive material such as ITO (indium tin oxide), IZO (indium zinc oxide), or ZnO (zinc oxide), or can be made of a thin opaque conductive material such as magnesium (Mg), calcium (Ca), aluminum (Al), or silver (Ag) and function as a transmissive electrode. The second electrode E2 can integrally extend on the thin-film transistor substrate SUB so as to cover the pixels.

The organic light-emitting display according to the present disclosure comprises color filters CF. One color filter CF can be allocated to each pixel. The color filters CF can comprise red (R), green (G), and blue (B) color filters that let light of red (R), green (G), and blue (B) colors pass through. The red (R), green (G), and blue (B) color filter CF are allocated to the corresponding red (R), green (G), and blue (B) pixels.

In an example, the color filters CF can be formed on the thin-film transistor substrate SUB. To prevent deterioration of the organic light-emitting diodes OLE due to exposure to the environment provided in the formation process of the color filters CF, an encapsulation layer ENC can be sandwiched between the color filters CF and the organic light-emitting diodes OLE. Moreover, the encapsulation layer ENC can prevent moisture and/or oxygen from entering the organic light-emitting diodes OLE. Accordingly, there is an advantage in that degradation in the lifetime and brightness of the organic light-emitting diodes OLE can be prevented. The encapsulation layer ENC can be a stack of at least one inorganic film and at least one organic film. The inorganic film and the organic film can alternate with each other. Neighboring color filters CF can be defined by a black matrix BM formed on the encapsulation layer ENC (see (a) of FIG. 4).

In another example, color filters CF can be formed on an opposing substrate CSUB facing a substrate SUB. The opposing substrate CSUB can be made of a transparent material to allow the light emitted from the organic light-emitting diode OLE to pass through. Neighboring color filters CF can be defined by a black matrix BM formed on the opposing substrate CSUB (see (b) of FIG. 4).

Light generated from inside the organic compound layer OL is emitted in multiple directions. To increase the luminous efficiency of the organic light-emitting diode OLE, the emitted light needs to be controlled to travel in a preset direction (hereinafter, referred to as an orientation direction). That is, a transmissive electrode and a reflective electrode can be disposed to face each other with the organic compound layer OL interposed between them, in order to control the direction of travel of the emitted light. In the present disclosure, the first electrode E1 can function as the reflective electrode, and the second electrode E2 can function as the transmissive electrode.

Part of the generated light that travels in the orientation direction passes through the transmissive electrode and is emitted out of the display device. The direction of another part of the light is changed to the orientation direction through the reflective electrode and then sequentially passes through the transmissive electrode and the color filter CF and is emitted out of the display device. In this way, the addition of the reflective electrode allows for changing the direction of travel of light that does not initially travel in the orientation direction to the orientation direction, thereby improving light efficiency.

However, referring further to FIG. 5 which illustrates problems with the related art, some L1 of the light emitted from the organic compound layer OL does not pass through the color filter CF allocated to the corresponding pixel but can travel toward a neighboring color filter CF. In this case, a color mixing defect occurs, causing a significant degradation in display quality, which can be a problem. In contrast, in an exemplary embodiment of the present disclosure, a black matrix BM can be included to improve such a color mixing defect. Furthermore, the cell gap CG or the width of the black matrix BM can be properly adjusted to effectively improve the color mixing defect using the black matrix BM.

However, some L2 of the light emitted from the organic compound layer OL can be wave-guided toward a neighboring pixel through total reflection between the interfaces of thin-film layers formed on the path of light travel, due to differences in refractive index between the thin-film layers, or can pass through the surface and inside of the bank BN and be wave-guided toward the neighboring pixel. The light directed toward a neighboring pixel is not sent out in the orientation direction, but can travel toward the neighboring color filter CF or can be reflected off the first electrode E1 and travel toward the neighboring color filter CF. The direction of travel of the light L2 can be shifted severely from the orientation direction, which can be a limitation in blocking this light L2 using the black matrix BM.

In a high-resolution display device with a high PPI (pixels per inch), the pixel size is relatively small, which makes the color mixing caused by the wave-guided light L2 more problematic. Accordingly, the exemplary embodiment of the present disclosure proposes a novel structure for minimizing the aforementioned color mixing defect.

First Exemplary Embodiment

Figure 6:
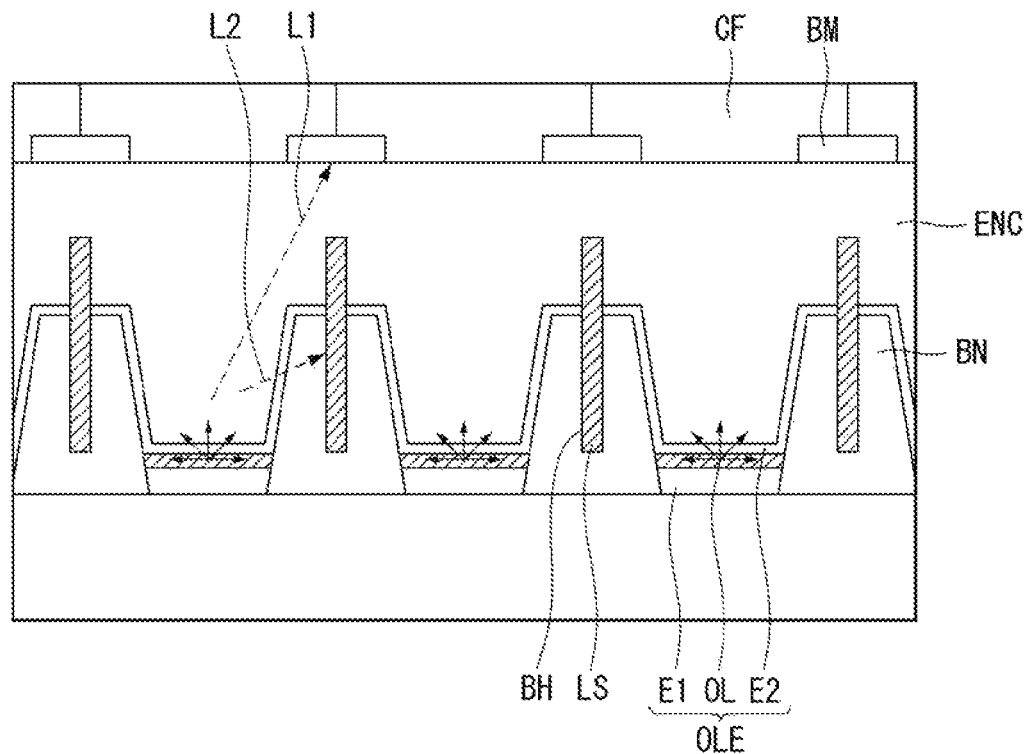
FIG. 6 is a cross-sectional view schematically showing an organic light-emitting display device according to a first exemplary embodiment of the present disclosure.

FIG. 6 is a cross-sectional view schematically showing an organic light-emitting display device according to a first exemplary embodiment of the present disclosure.

Referring to FIG. 6, an organic light-emitting display according to the first exemplary embodiment of the present disclosure comprises a thin-film transistor substrate SUB. Thin-film transistors T respectively corresponding to the pixels and organic light-emitting diodes OLE connected to the thin-film transistors T are placed on the thin-film transistor substrate SUB. The organic light-emitting diode OLE comprises a first electrode E1, a second electrode E2, and an organic compound layer OL interposed between the first electrode E1 and the second electrode E2.

Neighboring pixels can be partitioned by a bank BN, and the planar shape of each pixel PXL can be defined by the bank BN. Thus, the position and shape of the bank BN can be properly selected in order to form pixels PXL having a preset planar shape.

The organic light-emitting display device according to the first exemplary embodiment of the present disclosure comprises hollow portions BH formed in the bank BN and light stoppers LS inserted into the hollow portions BH. A plurality of hollow portions BH can be formed on the bank BN between neighboring pixels, and light stoppers LS can be individually inserted into the hollow portions BH.

The hollow portions BH can have the shape of a hole that fully penetrates the entire thickness of the bank BN and exposes the underlying layer of the bank BN, or can have the shape of a recess formed by partially recessing the top surface of the bank BN inward.

The light stoppers LS are fitted into the hollow portions BH and protrude toward the color filters CF. Thus, the top surface of the light stoppers LS can be spaced a preset distance apart from the top surface of the bank BN. The light stoppers LS can be correctly aligned to their positions compared to a simple stack structure, since they are fitted into the hollow portions BH.

The light stoppers LS can comprise a black material to block and/or absorb the light incident on the light stoppers LS. In an example, the light stoppers can comprise one of the following: carbon black, a mixed dye with a carbon black in it, a black resin, graphite powder, gravure ink, black spray, and black enamel. In another example, the light stoppers LS can comprise, but not limited to, a photoresist formed based on an organic black material.

A portion of the light stopper LS that protrudes outward from the bank BN can be can block and/or absorb the light that wave-guided between the interfaces of thin-film layers. And/or the portion of the light stopper LS can be can block and/or absorb the light traveling through the surface of the bank BN and directed toward a neighboring color filter CF. A portion of each light stopper LS that is fitted into the bank BN via the hollow portion BH can block and/or absorb the light traveling into inside of the bank BN and directed toward the neighboring color filter CF. Accordingly, the first exemplary embodiment of the present disclosure provides an organic light-emitting display device that improves display quality by significantly reducing color mixing defects.

Figure 7:
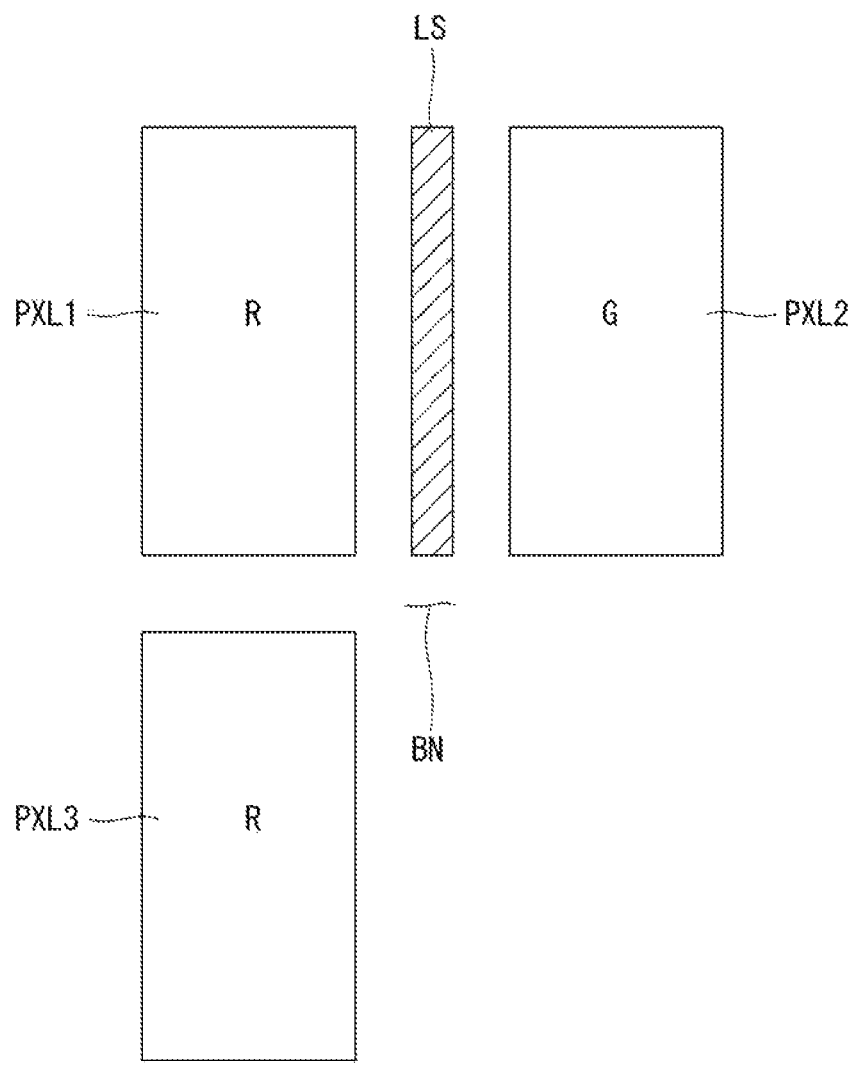
FIG. 7 is a view for explaining the positional relationship of a light stopper according to the present disclosure.

FIG. 7 is a view for explaining the positional relationship of a light stopper according to an example of the present disclosure.

Referring to FIG. 7, the light stopper LS can be selectively provided at a specific position. That is, the light stopper LS does not have to be placed between each neighboring pixel PXL in all areas but can be selectively provided between neighboring pixels PXL at a position where it is needed.

If the neighboring pixels PXL are pixels that emit light of the same color, a color mixing defect between the neighboring pixels PXL can not be a problem. Taking this into consideration, in the first exemplary embodiment, whether to place the light stopper LS between neighboring pixels PXL or not can be determined based on which color is allocated to the neighboring pixels PXL.

For example, if a first pixel PXL emits light of a first color, a pixel PXL neighboring the first pixel PXL in a first direction can be a second pixel PXL2 that emits light of a second color, and a pixel PXL neighboring the first pixel PXL1 in a second direction can be a third pixel PXL3 that emits light of the first color. Here, the light stopper LS can be formed between the first and second pixels PXL1 and PXL2 which emit light of different colors, and the light stopper LS can not be formed between the first and third pixels PXL1 and PXL3 which emit light of the same color. This offers the advantage of having a degree of freedom of the process, since the light stopper LS is formed selectively in areas where it is needed. Another advantage is that the bank BN is made relatively narrow in areas where the light stopper LS is not formed, thus resulting in an aperture ratio corresponding to the width of the bank BN.

Figure 8:
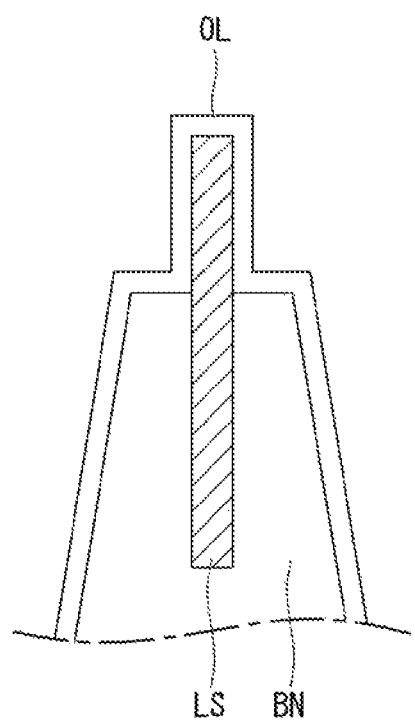
FIGS. 8 and 9 are views for explaining another advantage of the first exemplary embodiment of the present disclosure.
Figure 9:
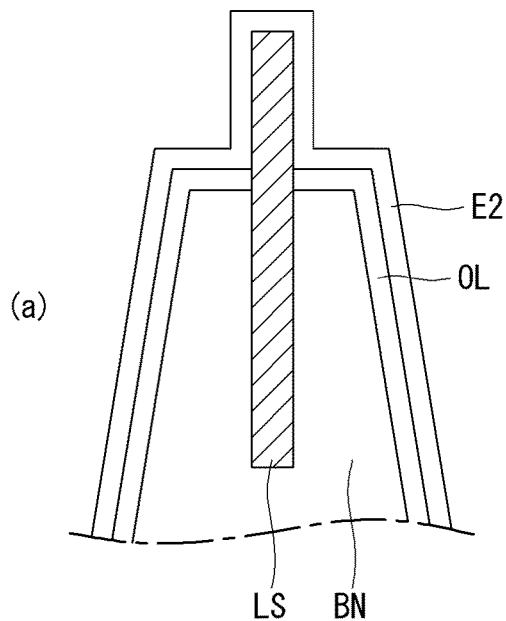
Figure 9:
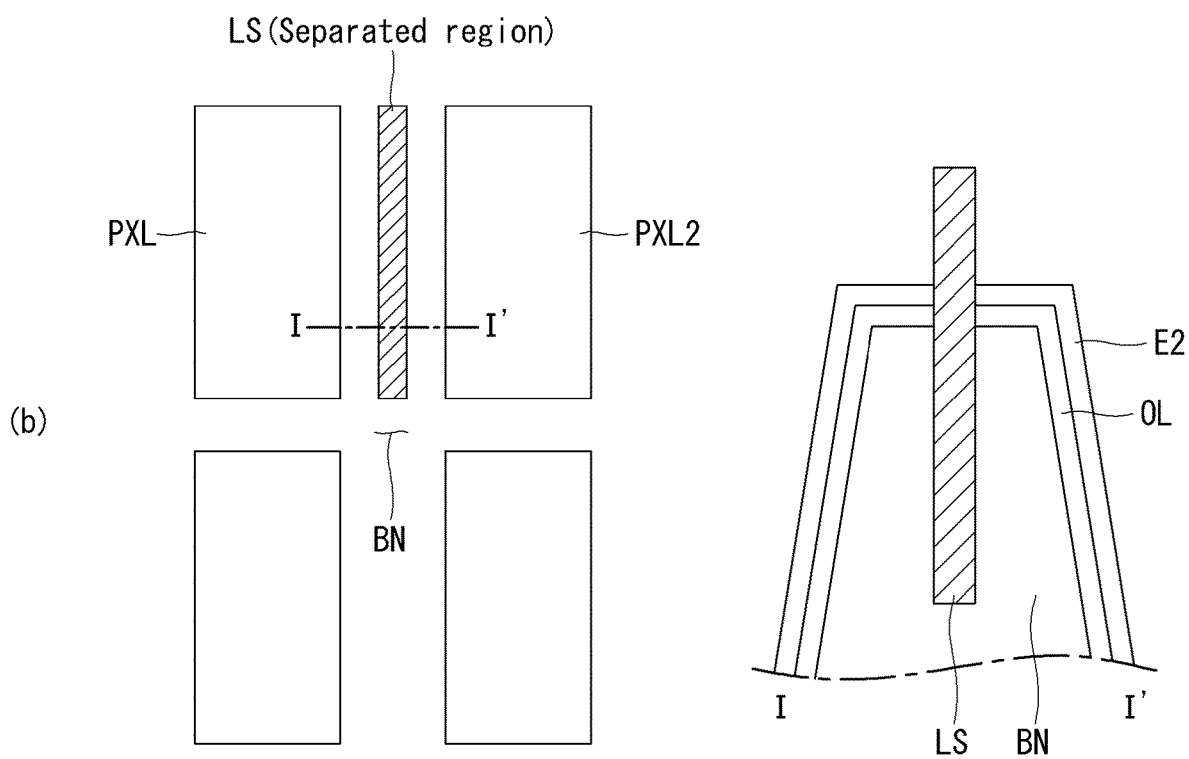

FIGS. 8 and 9 are views for explaining another advantage of the first exemplary embodiment of the present disclosure.

In high-resolution display devices which have a relatively small pixel pitch, light is emitted from unwanted pixels PXL due to a leakage current through the organic compound layer OL, and this can lead to a color mixing defect between neighboring pixels. For example, although neighboring pixels PXL are defined by a pixel definition layer such as a bank BN and spaced by a predetermined pitch, higher-resolution display devices have a much smaller pixel pitch, and therefore the color mixing defect caused by leakage current will occur more often. At least one layer that makes up the organic compound layer OL and has high conductivity—for example, the charge generation layer in a multi-stack structure—can serve as a leakage current flow path, which can be a problem.

Referring to FIG. 8, in the first exemplary embodiment of the present disclosure, light stoppers LS protruding further than the top surface of the bank BN are provided, and the organic compound layer OL is formed over the light stoppers LS, thereby providing a sufficiently long path of leakage current that can flow to neighboring pixels. That is, a relatively long flow path of leakage current can be provided, because a layer (e.g., charge generation layer) forming the flow path of leakage current is deposited along the shape of the surface of the light stoppers LS. Accordingly, the first exemplary embodiment can effectively eliminate leakage current and therefore avoid a significant degradation in display characteristics caused by the emission of light from unwanted pixels.

Referring to (a) and (b) of FIG. 9, in the first exemplary embodiment of the present disclosure, the organic compound layer OL comprising a layer serving as the path of leakage current can be separated in a certain region, in order to effectively eliminate leakage current. That is, as shown in the drawing, the organic compound layer OL can be physically separated in at least one region due to the stepped portion formed by the light stopper LS and the bank BN. Accordingly, the first exemplary embodiment of the present disclosure has the advantage of further minimizing the color mixing defect caused by leakage current, since the path of leakage current in at least one region can be blocked.

In this case, the second electrode E2 is formed in an integrated fashion so as to cover all pixels and supply low-level voltage to the individual pixels. It means that some pixels can not be driven if the second electrode E2 is physically separated into a plurality of parts. Thus, in the first exemplary embodiment of the present disclosure, the process method and material can be controlled in such a way that the organic compound layer OL is separated but the second electrode E2 is not separated (see (a) of FIG. 9).

Alternatively, in the first exemplary embodiment of the present disclosure, the organic compound layer OL and second electrode E2 at a specific position can be selectively separated by selectively placing the light stopper LS at the specific position. In this case, the path of leakage current can be blocked since the light stopper LS at the specific position is selectively separated. Also, the second electrode E2 at the specific position can be selectively separated, thereby preventing the pixel at the specific position from not working (see (b) of FIG. 9).

Second Exemplary Embodiment

Figure 10:
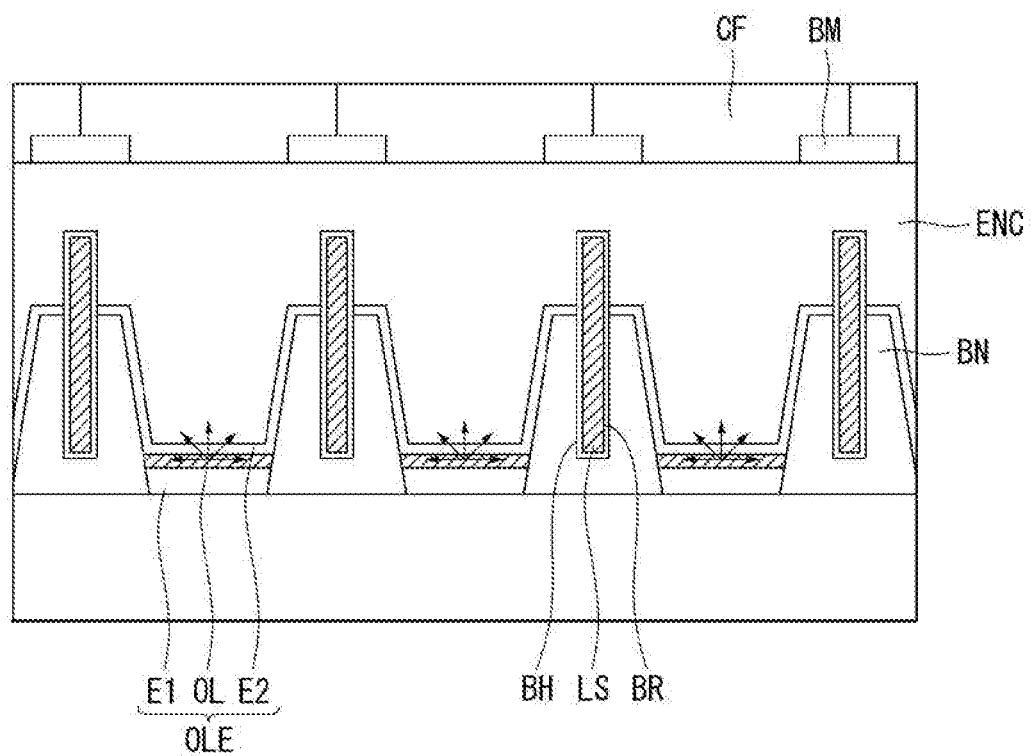
FIG. 10 is a cross-sectional view schematically showing an organic light-emitting display device according to a second exemplary embodiment of the present disclosure.

FIG. 10 is a cross-sectional view schematically showing an organic light-emitting display device according to a second exemplary embodiment of the present disclosure.

Referring to FIG. 10, an organic light-emitting display device according to the second exemplary embodiment of the present disclosure comprises a thin-film transistor substrate SUB. Thin-film transistors T respectively corresponding to the pixels and organic light-emitting diodes OLE connected to the thin-film transistors T are placed on the thin-film transistor substrate SUB. The organic light-emitting diode OLE comprises a first electrode E1, a second electrode E2, and an organic compound layer OL interposed between the first electrode E1 and the second electrode E2.

Neighboring pixels can be defined by a bank BN, and the planar shape of each pixel PXL can be defined by the bank BN. Thus, the position and shape of the bank BN can be properly selected in order to form pixels PXL having a preset planar shape.

The organic light-emitting display device according to the second exemplary embodiment of the present disclosure comprises hollow portions BH formed in the bank BN, light stoppers LS inserted into the hollow portions BH, and barriers BR wrapping around the light stoppers LS.

The hollow portions BH can have the shape of a hole that fully penetrates the entire thickness of the bank BN and exposes the underlying layer of the bank BN, or can have the shape of a recess formed by partially recessing the top surface of the bank BN inward.

The light stoppers LS are fitted into the hollow portions BH and protrude toward the color filters CF. Thus, the top surface of the light stoppers LS can be spaced a preset distance apart from the top surface of the bank BN. The light stoppers LS can be correctly aligned to their positions compared to a simple stack structure, since they are fitted into the hollow portions BH.

The light stoppers LS can comprise a black material to block and/or absorb the light incident on the light stoppers LS. In an example, the light stoppers can comprise one of the following: carbon black, a mixed dye with a carbon black in it, a black resin, graphite powder, gravure ink, black spray, and black enamel. In another example, the light stoppers LS can comprise, but not limited to, a photoresist formed based on an organic black material.

A portion of each light stopper LS that protrudes outward from the bank BN can be wave-guided between the interfaces of thin-film layers, or can block and/or absorb the light wave-guided through the surface and inside of the bank BN and directed toward a neighboring color filter CF. A portion of each light stopper LS that is fitted into the bank BN via the hollow portion BH can block and/or absorb the light wave-guided into the bank BN and directed toward the neighboring color filter CF. Accordingly, the second exemplary embodiment of the present disclosure provides an organic light-emitting display device that improves display quality by significantly reducing color mixing defects.

Meanwhile, the organic compound layer OL can be deteriorated due to an out-gas produced from a pigment forming the light stoppers LS. Thus, the organic light-emitting display device according to the second exemplary embodiment of the present disclosure can further comprise barriers BR surrounding the light stoppers LS in order to prevent deterioration of the organic compound layer OL caused by an out-gas. The barriers BR can be disposed to fully wrap around the light stoppers LS. The barriers BR can be made of an inorganic material such as a silicon oxide film (SiOx) or a silicon nitride film (SiNx), and can be composed of a single layer or multiple layers of the inorganic material.

Accordingly, the second exemplary embodiment of the present disclosure can prevent an out-gas produced from the light stoppers LS from entering the organic compound layer OL by having barriers BR fully covering the light stoppers LS. Therefore, the second exemplary embodiment of the present disclosure has the advantage of ensuring device reliability by preventing deterioration of the organic light-emitting diodes caused by the out-gas.

FIGS. 11A to 11D are views chronologically showing an example of a barrier formation method according to an example of the present disclosure.

Figure 11A:
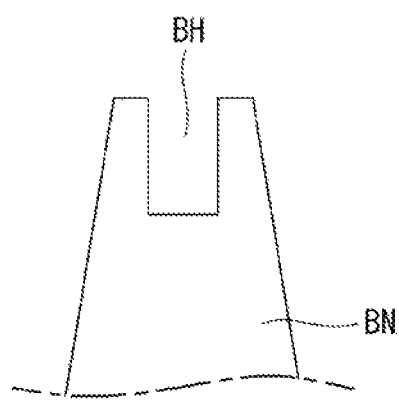
FIGS. 11A to 11D are views chronologically showing an example of a barrier formation method according to the present disclosure.

Referring to FIG. 11A, at least one hollow portion BH is formed on the bank BN. As mentioned previously, the hollow portion BH can be formed through the entire or part of the thickness of the bank B.

Figure 11B:
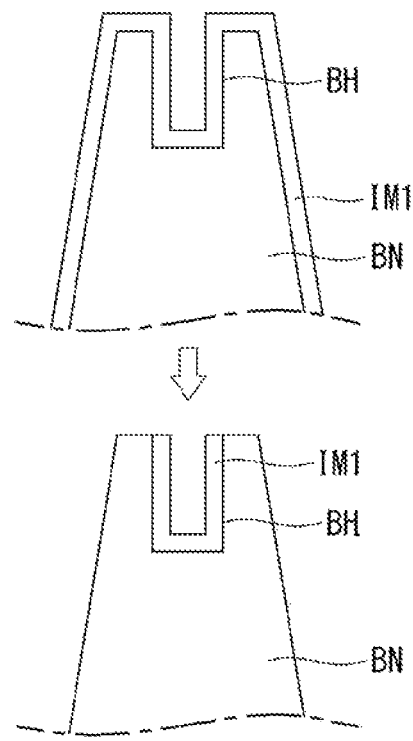

Referring to FIG. 11B, a first inorganic material IM1 is applied onto the bank BN where the hollow portion BH is formed. Afterwards, the first inorganic material IM1 can be patterned so that the first inorganic material IM1 is left at least within the hollow portion BH. Although the figure illustrates an example in which the first inorganic material IM1 is left only within the hollow portion BH, the present disclosure is not limited to this example and the first inorganic material IM1 can be patterned to such an extent that it is not left in the emitting region (e.g., first electrode E1—see FIG. 10).

Figure 11C:
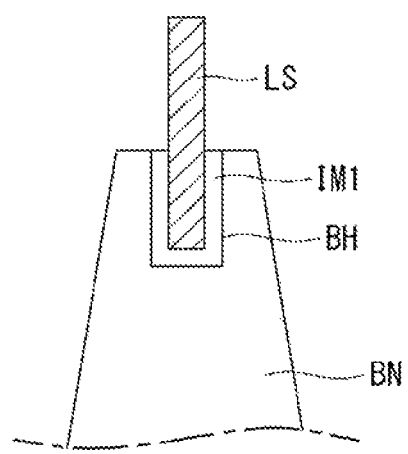

Referring to FIG. 11C, a light stopper LS is formed within the hollow portion BH in such a way that at least part of it is fitted into the hollow portion BH. The bottom of the light stopper LS within the hollow portion BH is disposed to be surrounded by the first inorganic material IM1.

Figure 11D:
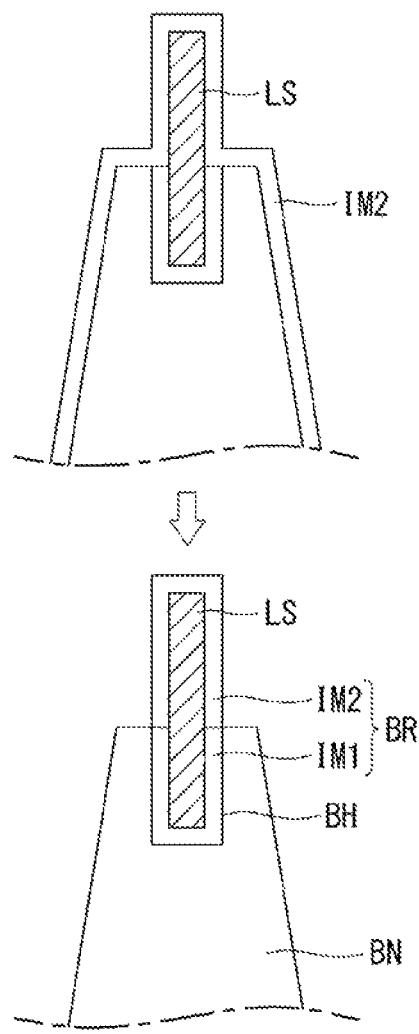

Referring to FIG. 11D, a second inorganic material IM2 is applied onto the bank BN where the light stopper LS is formed. Afterwards, the second inorganic material IM2 can be patterned so that the second inorganic material IM2 is left at least within the hollow portion BH. The second inorganic material IM2 can be patterned to such an extent that it is not left in the emitting region (e.g., first electrode E1—see FIG. 10).

The remaining first inorganic material IM1 and second inorganic material IM2 can be disposed to fully wrap around the light stoppers LS and serve as a barrier BR. That is, the barrier BR can be divided into a first portion containing the first inorganic material IM1 and a second portion containing the second inorganic material IM2. The first portion and the second portion can contain the same material or different materials. The second exemplary embodiment of the present disclosure can improve device reliability by effectively eliminating the problem of an out-gas produced from a pigment forming the light stopper LS.

Through the above description, those skilled in the art will appreciate that various modifications and changes are possible, without departing from the scope and spirit of the disclosure. Therefore, the technical scope of the present disclosure should be defined by the appended claims rather than the detailed description of the specification.

What is claimed is:

1. An organic light-emitting display device comprising:
   pixels:
   a bank that defines the pixels and has at least one hollow portion formed between the pixels which neighbor each other;
   a light stopper that blocks or absorbs light incident on the light stopper, at least part of which is inserted into the at least one hollow portion; and
   a barrier surrounding the light stopper,
   wherein the barrier is divided into a first portion and a second portion, and
   wherein the first portion and the second portion are made of different materials.

2. The organic light-emitting display device of claim 1, wherein a top surface of the light stopper is spaced a preset distance apart from a top surface of the bank.

3. The organic light-emitting display device of claim 1, wherein the at least one hollow portion has a shape of a recess formed by partially recessing a top surface of the bank inward.

4. The organic light-emitting display device of claim 1, wherein the light stopper is disposed between pixels that emit light of different colors.

5. The organic light-emitting display device of claim 1, wherein the pixels comprise:
   a first pixel that emits light of a first color;
   a second pixel that neighbors the first pixel in a first direction and emits light of a second color; and
   a third pixel that neighbors the first pixel in a second direction and emits light of the first color, wherein the light stopper is situated between the first pixel and the second pixel but not between the first pixel and the third pixel.

6. The organic light-emitting display device of claim 1, further comprising:
   first electrodes allocated individually to the pixels;
   an organic compound layer disposed on the first electrodes and covering the first electrodes; and
   a second electrode disposed on the organic compound layer and covering the organic compound layer,
   wherein the organic compound layer is physically separated on the bank in at least one region where the light stopper is placed.

7. The organic light-emitting display device of claim 6, wherein the second electrode is physically separated on the bank in the at least one region.

8. The organic light-emitting display device of claim 1, wherein the barrier includes an inorganic material.

9. The organic light-emitting display device of claim 1, wherein the light stopper is black in color.

\* \* \* \* \*